US005145382A

United States Patent [19]

Dickirson

[11] Patent Number: 5,145,382

[45] Date of Patent: Sep. 8, 1992

[54] MOLDED PLASTIC SURFACE-MOUNTABLE COAXIAL CONNECTOR

[75] Inventor: David M. Dickirson, Deerfield Beach, Fla.

[73] Assignee: Motorola, Inc., Schaumburg, Ill.

[21] Appl. No.: 800,299

[22] Filed: Nov. 29, 1991

[51] Int. Cl.[5] .............. H05K 1/00

[52] U.S. Cl. .............. 439/63; 439/581; 439/931

[58] Field of Search .............. 439/931, 88, 63, 581, 439/578, 675

[56] References Cited

U.S. PATENT DOCUMENTS

| | | | |
|---|---|---|---|
| 3,201,722 | 8/1965 | May et al. . | |
| 3,229,241 | 1/1966 | Kao | 439/931 |
| 3,258,735 | 6/1966 | Valle . | |
| 3,363,221 | 1/1968 | Stark | 439/931 |
| 3,551,874 | 12/1970 | Volinskie | 439/931 |
| 3,909,759 | 9/1975 | Ouellette et al. | 439/931 |
| 3,958,851 | 5/1976 | Evans | 439/931 |
| 4,842,527 | 6/1989 | Tellam . | |
| 4,892,491 | 1/1990 | Budano, II et al. . | |
| 4,902,235 | 2/1990 | Tonooka | 439/931 |

OTHER PUBLICATIONS

IBM Technical Disclosure Bulletin "Multistage Through-hole", E. Vberbacher pp. 882, vol. 10, No. 7.
Sales brochure from "GE-Plastics" pp. 4 and 12 (PLA-0236-12/88-00).

*Primary Examiner*—David L. Pirlot
*Attorney, Agent, or Firm*—Juliana Agon

[57] ABSTRACT

An electrical socket (10) for interconnecting a printed circuit surface (11) and a coaxial connector (12), comprising a molded plateable dielectric body (10'). The body (10') has a plated center contact portion (20) for selectively receiving the coaxial connector (12) and surface mounting with the printed circuit surface (11). Similarly, the body (10') also has a plated ground contact portion (21) for selectively receiving the coaxial connector (12) and surface mounting with the printed circuit surface (11), wherein the portions are integrally formed as a single piece (10').

10 Claims, 3 Drawing Sheets

MOLDED PLASTIC SURFACE-MOUNTABLE COAXIAL CONNECTOR

TECHNICAL FIELD

This invention relates generally to electrical sockets and in particular to a socket assembly for connecting a circuit board to a coaxial connector.

BACKGROUND

In radio frequency (RF) devices such as portable two-way radios, it is often necessary to provide an electrical RF connection between the printed circuit (PC) board, or (PCB) that is located within a radio housing and a coaxial connector mounted on the radio housing. The interconnection is required to present the proper impedance between the circuit board and the coaxial connector.

One approach to this problem is to utilize coaxial cables such as miniature coaxial cables which are manually soldered to both the circuit board and the coaxial connector. This approach has several drawbacks. First of all, soldering a coaxial cable is inherently a manual operation that does not lend itself to automation and is consequently both time consuming and costly. Additionally, the connection is semi-permanent, that is, it requires unsoldering to disconnect the circuit board from the coaxial connector. This inhibits the removal and insertion of the circuit board from the housing.

One well known alternative approach involves the use of a PCB coaxial connector or socket to receive the connector. The ends of the coaxial cable are soldered to the coaxial connector while the PCB connector includes contact legs which are inserted into the printed circuit board to allow connection and removal of the circuit board from the housing. This approach still requires manual soldering of the socket. In addition, these PCB connectors are usually expensive and utilize PC board area. Even if the conventional PCB connectors are made small enough, they still require hand soldering, possess no mate locking feature, or are not surface-mountable. Thus, there is a need for a socket that provides the proper impedance for an RF connection and is surface-mountable directly onto the circuit board in an automatic assembly process.

SUMMARY OF THE INVENTION

Briefly, according to the invention, an electrical socket for interconnecting a printed circuit surface and a coaxial connector, comprises a molded plateable dielectric body. The body has a plated center contact portion for selectively receiving the coaxial connector and surface mounting with the printed circuit surface. Similarly, the body also has a plated ground contact portion for selectively receiving the coaxial connector and surface mounting with the printed circuit surface, wherein the portions are integrally formed as a single piece.

DETAILED DESCRIPTION OF THE PREFERRED EMBODIMENT

Figure 1:
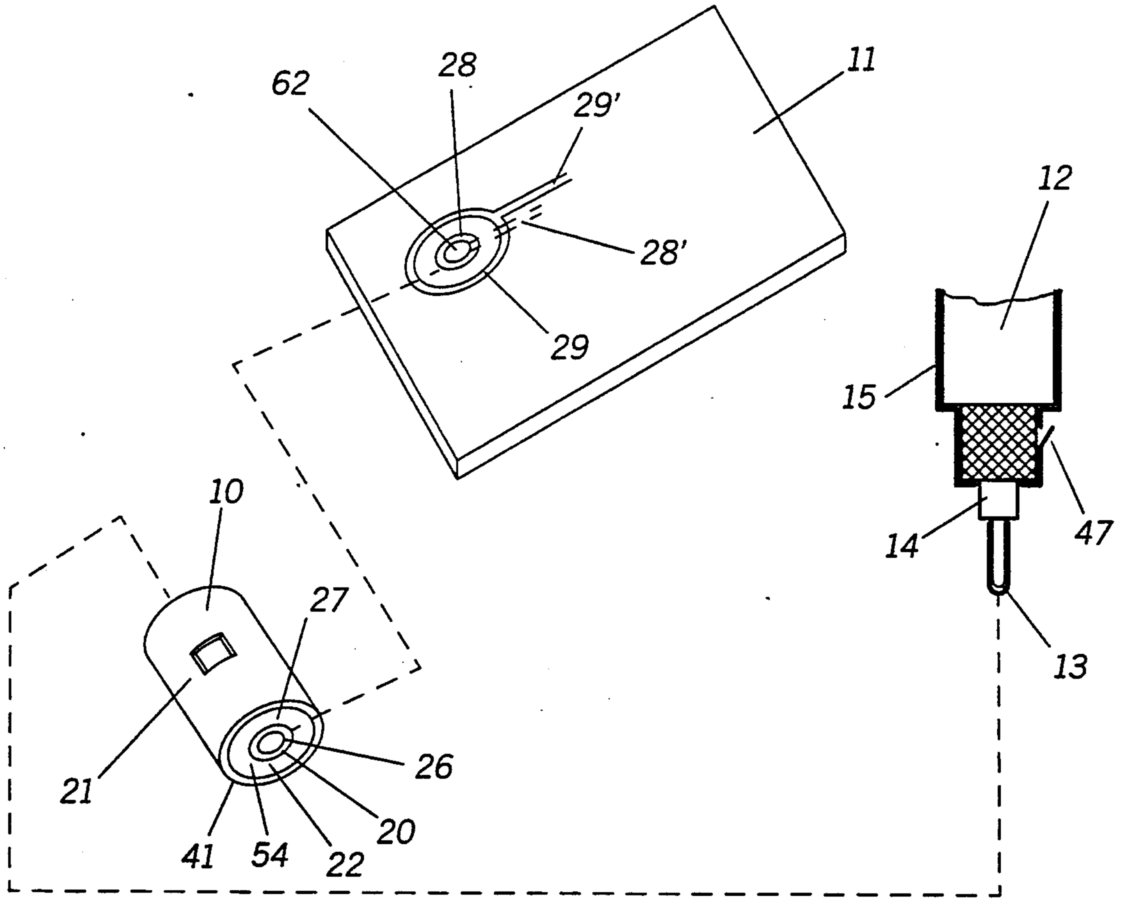
FIG. 1 is a perspective view of a contact assembly in accordance with the present invention

Referring to FIG. 1, it will be understood that a contact or socket 10 is mounted to and carried by a printed circuit board, a stripline, or any other type of suitable surface or substrate 11. A circular positive circuit trace 28 is shown, extending through an aperture 62 of the substrate 11, to connect with a center conductor strip 28'. The center conductor 28' is disposed within the substrate 11, below a ground conductor strip 29', which connects to the exterior or ground circuit trace 29, on top of the substrate surface, to form a microstrip. However, if desired, the ground conductor strip 29' could be extended to wrap around the opposed surface of the printed circuit board 11, to provide a stripline construction.

The contact or socket 10 is designed to be placed on the circuit board 11, in order to interconnect a coaxial connector 12 with the board 11 via the socket 10. The coaxial connector 12 can be mounted through a wall of a housing (not shown) in which the circuit board 11 is carried.

The coaxial connector 12 is similar to existing cables except for an optional lanced portion or extension 47, which when mated to the socket 10, provides a positive retention feature. The coaxial connector 12 further includes a center pin or an inner conductor or contact 13 that may extend into the interior of the housing for engagement with the contact or socket 10. About the pin 13 is an insulator or dielectric material 14, which is in turn surrounded by a coaxial ground contact or outer conductor 15 which provides the other contact point for the socket 10.

Referring to FIGS. 1-4, the socket 10 includes a plated inner center contact portion 20 of a unitary body 10', a similarly plated outer ground contact portion 21 of the unitary body 10', and a dielectric portion 22, which is the unplated unitary body 10' underlying and separating the inner and outer plated portions 20 and 21.

The inner plated portion 20 includes a plated inner tubular center conductor receptacle 25 for receiving the inner conductor or contact 13 of the coaxial connector 12, and an inner contact portion 26 that surrounds and connects to the inner center conductor receptacle 25, adjacent to the circuit board 11. The inner contact portion 26 is the innermost annular edge of a planer base portion 27 that lies in engagement or surface contact with the circuit board 11 and provides a stable base for the socket 10. As manipulated by a robot, the socket 10 is surface mounted onto the circuit board 11 and soldered (not shown), in an automatic solder reflow process. The inner contact 26 surface mounts onto the positive or inner circuit trace 28 of the circuit board 11 to provide the positive conductive path between the coaxial connector 12 and the circuit board 11.

The interior cylindrical wall of the center conductor receptacle 25, is defined by a plated inner narrow tubular aperture 30 on a first opposed end of the socket 10 to provide a corresponding tubular surface for engagement with the center pin 13 of the coaxial connector 12. The inner aperture 30 thus extends perpendicularly from the circuit board 11 for receiving the center conductor pin 13 and subsequent pin engagement with the center receptacle 25.

In the preferred embodiment, the inner or center receptacle 25 includes several optional features. As is viewed in FIG. 2, there is a first chamfered section 31 at the inner end of the inner tubular aperture 30, spaced from the circuit board 11, to facilitate the insertion of the center pin 13. At the first opposed end or base of the socket 10, the inner conductor receptacle 25 further includes a circumferential plated protrusion 52 for preventing excessive solder wicking.

The outer plated portion 21 includes an exterior plated peripheral surface 40 of the unitary cylindrical body 10′ that circumscribes and connects (on the second opposed end or opening of the socket 10) to an outer or ground conductor receptacle 45 for receiving the inner conductor or contact 13 of the coaxial connector 12. A ground contact 41, more clearly shown in FIG. 1, will be surface mounted on the circuit board 11 for providing the ground conductive path between the coaxial connector 12 and the board 11. As part of the same flat planer surface 27, the ground contact is basically the circumferential rim or edge that is soldered to the ground or outer circuit trace 29 of the circuit board 11. The plated peripheral surface 40 thus extends from the printed circuit board 11, and over the second opposed end of the socket 10, into an outer plated wide aperture or socket opening 42 for providing the outer conductor receptacle 45 for selectively engaging the ground contact conductor 15 of the coaxial connector 12.

Optionally, the second opposed end forming a circumferential rim or edge 43 is connected to the circumscribed aperture 42 by a second chamfered edge 44 for facilitating the insertion of the ground conductor 15 of the coaxial connector 12 into the outer conductor receptacle 45 for selective engagement. To provide an optional locking feature, the outer conductor receptacle 45 also includes a rectangular aperture 46 for receiving the corresponding extension 47 of the coaxial connector 12.

Figure 2:
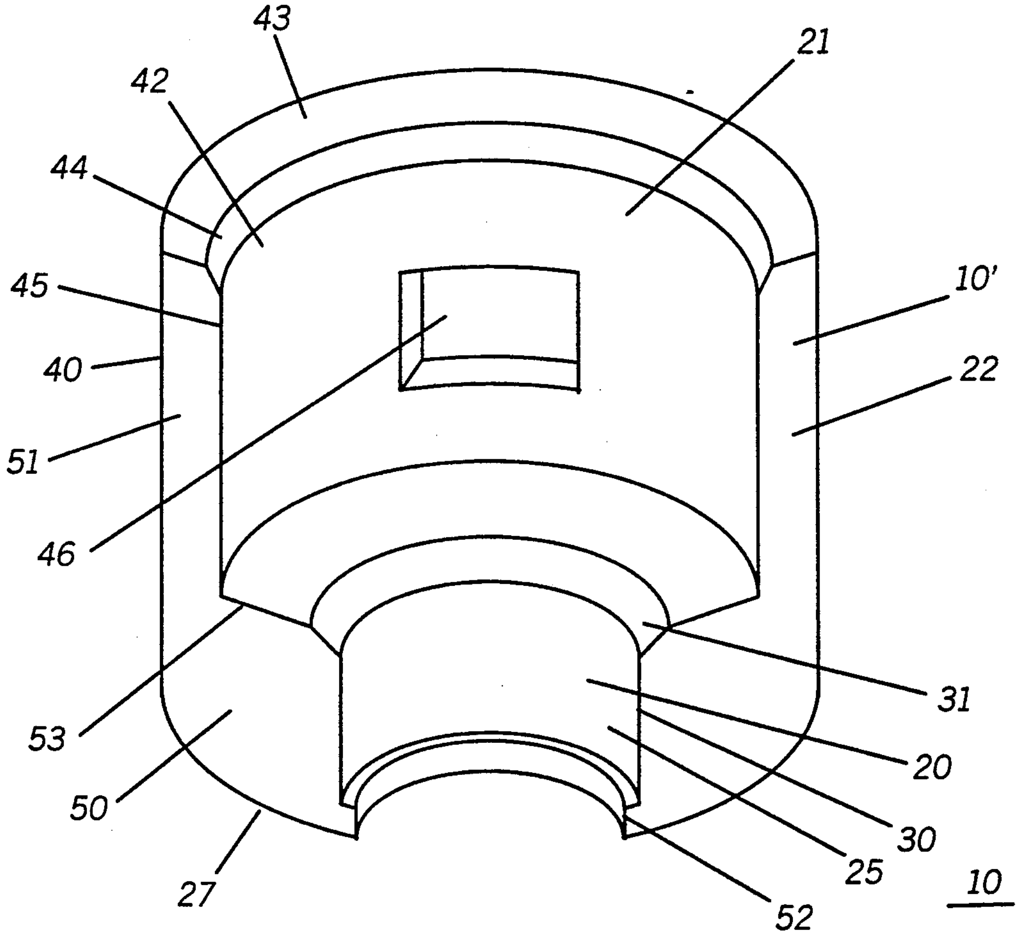
FIG. 2 is a perspective view, partially in cross-section, of the socket 10 of FIG. 1.
Figure 3:
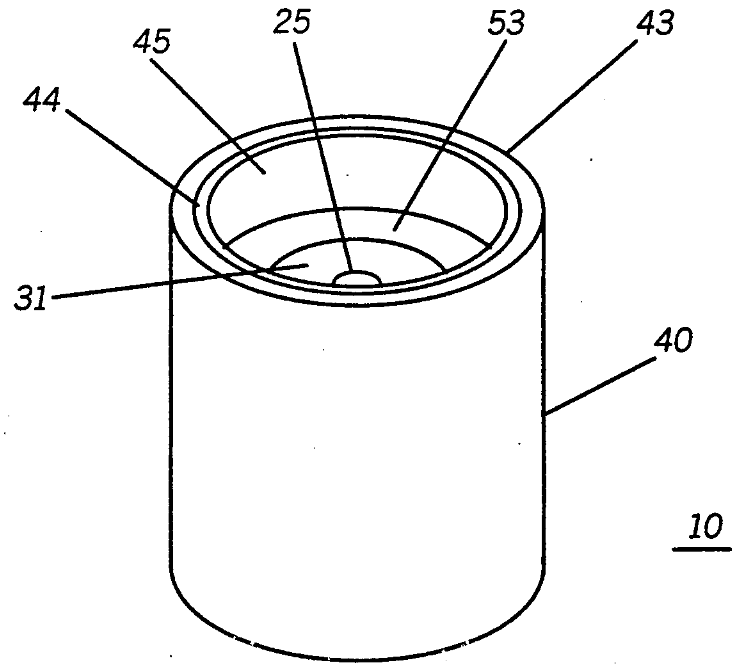
FIG. 3 is a perspective view of the socket 10 of FIG. 1.
Figure 5:
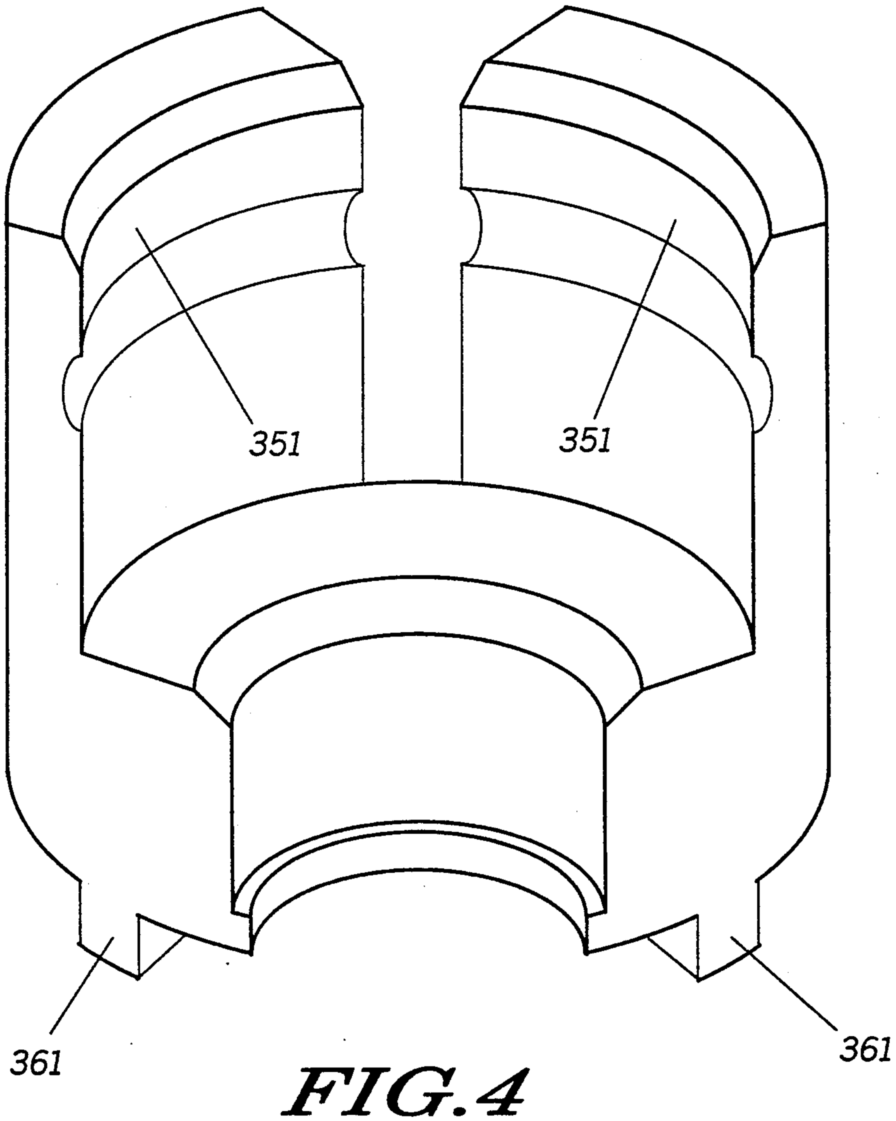
FIG. 5 is a partial perspective and cross-sectional view of some additional features of the socket in accordance with the present invention.
Figure 4:
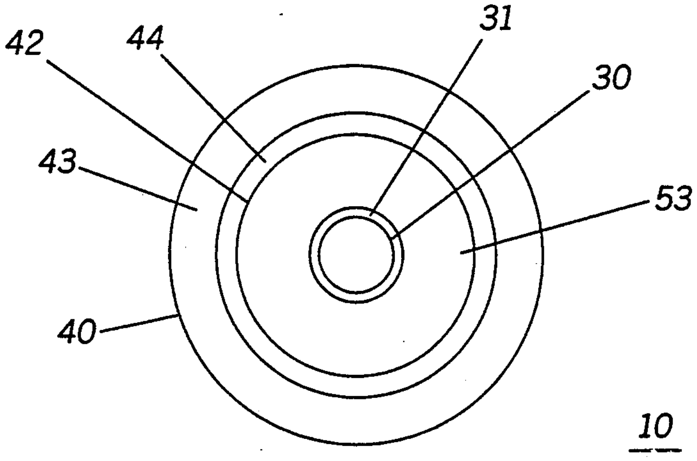
FIG. 4 is a top plan view of the socket 10 of FIG. 1.

Referring to FIG. 5, instead of or in addition to the rectangular aperture 46 of FIG. 2, the socket 10 may optionally include molded and plated spring fingers 351 for better mate retention. For better alignment of the socket 10 on the PC board 11, the socket 10 may optionally include tabs 361 to be received by corresponding recesses on the board 11.

Referring again to FIGS. 1-4, the dielectric portion 22 is utilized to provide the desired 50 ohm impedance for the socket 10 in conjunction with the plated inner and outer portions 20 and 21 and further serves as an electrical insulator. The dielectric portion 22, which in the preferred embodiment is unplated and molded of a plateable plastic, or other plateable dielectric material, includes a lower wall portion 50 that is, substantially, the unplated material between the inner tubular aperture 30 and the exterior plated surface 40. The lower wall 50 is connected to and extends into an upper cylindrical wall 51.

A top portion of the bottom wall 50 forms the inner surface 53 of the socket 10 that is disposed with a layer of resist for isolating the plated outer aperture 42 from the plated inner aperture 30. Similarly, the bottom surface of the bottom wall 50, forms the base portion 27 in which an intermediate circular ring 54 is disposed with a layer of resist layer for isolating the inner or center contact 26 from the ground contact 41.

It is thought that it is apparent from the foregoing description of parts that the socket 10 is integrally formed of a plateable dielectric material 22. As a further option, the circuit board 11 and the socket 10 may also be integrally formed. The dielectric 22 is preferably a moldable and plateable plastic such as ULTEM TM. (ULTEM TM is a trademark of the General Electric Corporation).

Alternatively, the socket 10 can also be produced using two different plastics molded together. One plastic that would accept plating, while the other would not such as a non-catalyzed plastic.

Assuming the high temperature plastic such as ULTEM TM is used, the socket 10 is plated everywhere except where the resist is applied (53 and 54). The inner cylindrical surface of the lower wall 50 is plated to provide the inner conductor receptacle 25 to contact the inner conductor 13 of the coaxial connector 12. Similarly, the inner cylindrical surface of the upper wall 51 is plated to form the outer receptacle 45 having the outer aperture 42 and the second opposed end or the top of the upper wall 51 is also plated to electrically contact the outer or ground conductor 15 of the coaxial conductor 12. Thus, the exterior side of the upper and lower walls 51 and 50 forms the exterior plated surface 40 to provide the ground conductor path to connect the outer or ground conductor 15 of the coaxial connector 12 to the corresponding ground circuit trace 29 of the printed circuit board 11. The interior surface of the bottom wall 50 similarly provides the center or positive conductor path for the center conductor pin 13 of the coaxial connector and the corresponding positive circuit trace 28 of the printed circuit board 11.

The resist on the intermediate surface 53 therefore creates a boundary, between the center conductor receptacle 25 and the outer conductor receptacle 45, to provide the desired 50 ohm impedance. Similarly, the resist applied on the intermediate circular base ring 54 isolates the inner and outer plated portions 20 and 21. The resultant pattern formed on the base portion 27 is then matched on the printed circuit board 11 for surface mounting and/or stripline applications.

Even though a cylindrical socket has been shown, the present invention contemplates any variation that utilizes a plateable dielectric to form a surface-mountable unitary socket. A unitary body is molded into separate receptacles to receive the corresponding conductors of a connector. In addition, the unitary body is plated everywhere except where resist has been applied to separate the two receptacles in order to form a single unitary socket that is very inexpensive to manufacture and easily placed by a robot.

What is claimed is:

1. An electrical socket for interconnecting a printed circuit surface and a coaxial connector, the socket comprising:

a molded plateable dielectric body having

- a plated center contact portion for selectively receiving the coaxial connector and surface mounting with the printed circuit surface; and
- a plated ground contact portion for selectively receiving the coaxial connector and surface mounting with the printed circuit surface;

wherein the portions are integrally formed as a single piece.

2. An electrical socket comprising:

a molded plateable dielectric body having

- a plated center contact portion for selectively engaging the coaxial connector, the center contact portion comprising:

a plated center conductor receptacle portion, and a plated base center contact surrounding the center conductor receptacle portion;

a plated ground contact portion for selectively engaging the coaxial connector, the ground contact portion comprising a plated ground conductor receptacle portion concentric with the plated conductor receptacle portion, and a base plated ground contact surrounding the ground conductor receptacle portion, the plated base center and ground contacts comprising a planar base portion for surface mounting the socket with a printed circuit surface; and a resistive non-plated portion isolating the plated center contact portion from the plated ground portion;

wherein the portions are integrally formed as a single piece.

3. An electrical socket for interconnecting a printed circuit surface and a coaxial connector, the socket comprising:

a molded plateable plastic cylindrical body comprising dielectric having a plated ground contact portion, having a wide plated cylindrical aperture for selectively receiving the coaxial connector, and a ground base contact for surface mounting with the printed circuit surface;

a plated center contact portion, concentrically spaced by the dielectric within the plated ground contact portion, the center contact portion having a narrow cylindrical plated aperture for selectively receiving the coaxial connector, and a center base contact for surface mounting with the printed circuit surface;

wherein the portions are integrally formed as a single piece.

4. The socket of claim 3 wherein the plated ground contact portion comprises plated peripheral wall and top surfaces of the cylindrical body encircling the wide cylindrical aperture.

5. The socket of claim 3 wherein the circuit board comprises a strip line having conductors corresponding to the base contacts of the socket for surface mounting.

6. The socket of claim 3 wherein the circuit board and the socket are integrally formed as one piece.

7. The socket of claim 3 wherein the plated ground contact portion includes retention means.

8. The socket of claim 7 wherein the retention means comprises an aperture for receiving a corresponding protrusion of the coaxial connector.

9. The socket of claim 3 wherein the molded plateable plastic cylindrical body further comprising:

an inner surface, formed by the 50 ohm separation between the apertures and disposed with a layer of resist for isolating the plated wide aperture from the plated narrow aperture; and a base surface disposed with a layer of resist for isolating the center base contact from the ground base contact.

10. The socket of claim 9 wherein the molded plateable plastic cylindrical body is everywhere plated except on the inner and base surfaces where the layer of resist has been disposed.

* * * * *